United States Patent
Yu et al.

(10) Patent No.: US 6,556,051 B2
(45) Date of Patent: Apr. 29, 2003

(54) APPARATUS FOR PROVIDING BOTH SUPPORTS INCLUDING SYNCHRONOUS DYNAMIC RANDOM ACCESS MEMORY (SDRAM) MODULE AND DOUBLE DATA RATE (DDR) DRAM MODULE

(75) Inventors: Chia-Hsing Yu, Taipei Hsien (TW); Nai-Shung Chang, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/930,797

(22) Filed: Aug. 14, 2001

(65) Prior Publication Data

US 2002/0039045 A1 Apr. 4, 2002

Related U.S. Application Data

(60) Provisional application No. 60/237,532, filed on Oct. 4, 2000.

(30) Foreign Application Priority Data

Jan. 10, 2001 (TW) ........................................ 90100487 A
Jan. 10, 2001 (TW) ........................................ 90100488 A
Jan. 10, 2001 (TW) ........................................ 90100489 A

(51) Int. Cl.[7] .............................................. H03B 21/00
(52) U.S. Cl. .................... 327/105; 327/106; 365/189.01
(58) Field of Search ................................. 327/105, 106, 327/107, 141, 142, 564, 407, 408; 365/185.18, 230.06

(56) References Cited

U.S. PATENT DOCUMENTS

| | | | | | |
|---|---|---|---|---|---|
| 5,019,785 A | * | 5/1991 | Fognini et al. | ............. | 327/105 |
| 5,367,212 A | * | 11/1994 | Rabii | ......................... | 315/370 |
| 5,615,142 A | * | 3/1997 | Hyatt | .......................... | 365/45 |
| 6,150,891 A | * | 11/2000 | Welland et al. | ............. | 327/105 |
| 6,166,569 A | * | 12/2000 | McQuilkin | ................... | 327/105 |

* cited by examiner

Primary Examiner—Timothy P. Callahan
Assistant Examiner—Linh Nguyen
(74) Attorney, Agent, or Firm—J. C. Patents

(57) ABSTRACT

An apparatus for providing both supports including synchronous dynamic random access memory module and the double data rate dynamic random access memory module is provided. A motherboard can support standard synchronous dynamic random access memory and dual data rate dynamic random access memory by using the disable and enable functions of the terminator. The invention reduces manufacturing production waste due to complex fabrication process of memory module. In addition, the trouble of upgrading the computer by consumer can be eliminated.

13 Claims, 3 Drawing Sheets

APPARATUS FOR PROVIDING BOTH SUPPORTS INCLUDING SYNCHRONOUS DYNAMIC RANDOM ACCESS MEMORY (SDRAM) MODULE AND DOUBLE DATA RATE (DDR) DRAM MODULE

CROSS-REFERENCE TO RELATED APPLICATION

This application claims the priority benefit of U.S. provisional application serial No. 60/237,532, filed on Oct. 4, 2000 and Taiwan application serial nos. 90100487, 90100488, 90100489, filed together on Jan. 10, 2001.

BACKGROUND OF THE INVENTION

1. Field of the Invention

The invention relates generally to a component of a motherboard in a PC system and more particularly to an apparatus that supports both synchronous dynamic random access memory module and the double data rate dynamic random access memory module.

2. Description of the Related Art

Digital information is often stored in dynamic random access memory (DRAM). One type of DRAM transfers information synchronously with a clock signal. This type of DRAM is referred to as synchronous DRAM (SDRAM). SDRAM provides a burst read access (when programmed for burst length of 4). In case of 64-bit data bus interface system, such a transfer involves 32 bytes of data per SDRAM access. Currently PC systems typically use such an arrangement.

SDRAM transfers information once every clock cycle of the clock signal, such as the rising edge of the clock signal. Nevertheless, DDR DRAM transfers data on each edge of the clock signal (i.e., twice every clock cycle of the clock signal), thus doubling the peak throughput of the memory device as compared with SDRAM. DDR DRAM thus provides a burst of eight data transfers on every burst read access (when programmed for burst length of 4). As a result, the operation speed of the memory can be increased.

The operation difference between the synchronous dynamic random access memory and the double data rate dynamic random access memory is as follows. (1) The SDRAM works in normal clock signal, and the DDR DRAM works in differential clock signal. (2) The VDD of SDRAM is 3.3V, and the VDDQ of DDR DRAM is 2.5V. (3) SDRAM does not require a reference voltage, and the DDR DRAM requires a reference voltage of ½ VDDQ. (4) The data bus connected to SDRAM is a normal CMOS logic, and the data bus connected to DDR DRAM is a series stub terminated logic 2 ($SSTL_{13}2$). (5) The data bus connected to SDRAM does not require a terminated voltage VTT, and the data bus connected to DDR DRAM requires a terminated voltage VTT to absorb the reflected electric wave. (6) The data bus connected to SDRAM does not require a pull-up resistor, while the data bus connected to DDR DRAM requires a pull-up resistor. The superiority of the DDR DRAM includes its double data rate.

Currently, the motherboard supports either the SDRAM module or the DDR DRAM module. Cause of the memory module slot cannot support simultaneously both the SDRAM and the DDR DRAM. Also, support for both memory technologies would avoid obstacles to upgrading memory within a computer system. Thus, a technique is needed to provide compatibility for both SDRAM and DDR DRAM within a common system.

SUMMARY OF THE INVENTION

According to one embodiment of the principle of the present invention, a synthesizer comprises terminator of which the conduction is controllable. By applying the synthesizer to a motherboard, the user has the great flexibility in using different memory modules.

The invention is embodied in an synthesizer comprising a first signal terminal, a second signal terminal, a first enable pin, a terminator, a first electronic switch and a second electronic switch. The first and the second signal terminals are used for external connection. The first electronic switch has one terminal coupled to the first signal terminal and the other terminal coupled to the terminator. A control terminal of the first electronic switch is coupled to the first enable pin to control whether the terminator is conducted with the first signal terminal by the first enable pin. The second electronic switch has one terminal coupled to the first signal terminal and the other terminal coupled to the second signal terminal. The control terminal of the second electronic switch is coupled to the first enable pin to control whether the first and the second signal terminals are conducted with each other.

The above synthesizer further comprises a first source pin. The terminator has a first terminal and a second terminal. The first terminal of the terminator is connected to the first source pin, and the second terminal of the terminator is connected to the first electronic switch. The synthesizer can also comprise a second source pin. The first source pin and the second source pin are located in symmetric positions of the package of the synthesizer, and the first source pin is coupled to the second source pin. The first and the second source pins can also be formed on the same side of the package with an uppermost and lowermost symmetric position. Thus, the source pins of the synthesizer and other synthesizers can be connected in series. The synthesizer can also comprise a second enable pin. The first enable pin and the second enable pin are located in symmetric positions of the package of the synthesizer. The first enable pin is coupled to the second enable pin. The above electronic switches can be made of transmission gate.

The invention further provides a motherboard that supports memory module slots both with and without a terminator. The motherboard comprises a first memory module slot, a second memory module slot, a synthesizer coupled to the first and the second memory module slots and a control chip set. The first memory module slot is used to connect a first memory module and requires a terminator for operation. The second memory module slot is used to connect a second memory module. The synthesizer is coupled to both the first and the second memory module slots. When the first memory module slot is inserted with the first memory module, the synthesizer provides an equivalent terminator. When the second memory module slot is embedded with the second memory module, the synthesizer does not provide an equivalent resistor. The control chip set is coupled to the first memory module slot and the synthesizer. When the first memory module is embedded in the first memory module slot, the control chip set controls the operation mode of the first memory module.

In the above motherboard, the first memory module includes a double data rate dynamic random access memory, while the second memory module includes a synchronous dynamic random access memory. The motherboard further comprises a voltage modulator coupled to the synthesizer to provide a terminal voltage and a clock generator coupled to the first and the second memory module slots. When the first memory module is embedded in the first memory module slot, a differential clock signal is generated. When the second memory module is embedded in the second memory module slot, a normal clock signal is generated.

Both the foregoing general description and the following detailed description are exemplary and explanatory only and are not restrictive of the invention, as claimed.

BRIEF DESCRIPTION OF THE DRAWINGS

Other features and advantages of the present invention will be come apparent by reference to the following detailed description when considered in conjunction with the accompanying drawings, in which.

DESCRIPTION OF THE PREFERRED EMBODIMENTS

Aspects of the present invention include methods and apparatus for designing an integrated circuit. In the following description, specific information is set forth to provide a thorough understanding of the present invention. Well-known circuits and devices are included in block diagram form in order to not to complicate the description unnecessarily. Moreover, it will be apparent to one skill in the art that specific details of these blocks are not required in order to practice the present invention.

Figure 1:
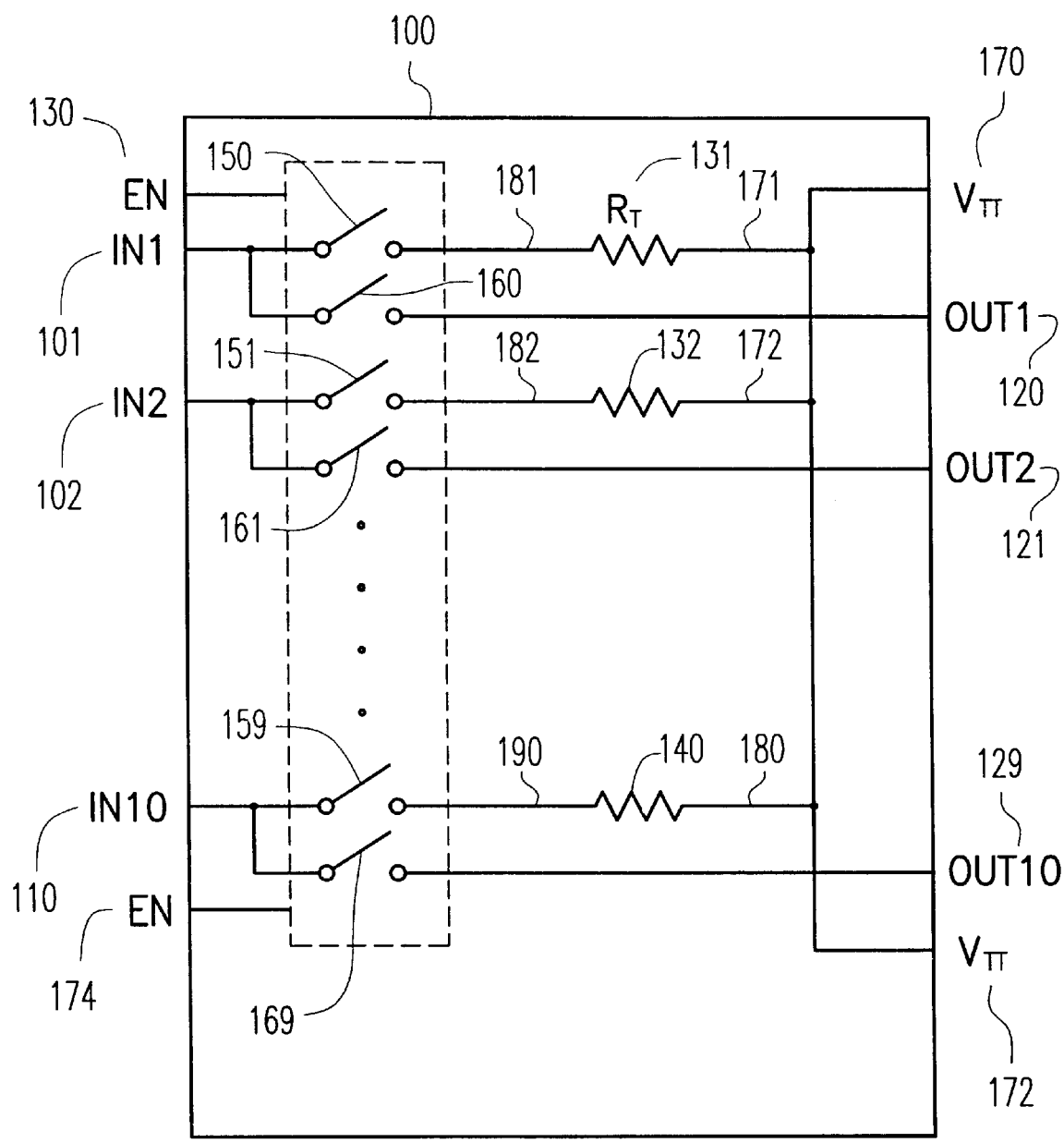
FIG. 1 is shows a schematic drawing of a synthesizer in one embodiment of the invention.

FIG. 1 shows one embodiment of a synthesizer according to the invention. The synthesizer comprises first signal terminals 101–110, second signal terminals 120–129, a first enable pin 130, a second enable pin 174, a first source pin 170, a second source pin 172, terminators 131–140, first electronic switches 150–159 and second electronic switches 160–169. The first and second signal terminals 101–110 and 120–129 are used for external connection. Each of the first electronic switches 150–159 has one terminal connected to the first signal terminals 101–110 and the other terminal connected to the terminators 131–140. The control terminals of the first electronic switches 150–159 are connected to the first enable pin 130, which can then control the conduction between the terminators 131–140 and the first signal terminals 101–110. Each of the second electronic switches 160–169 has one terminal connected to the first signal terminals 101–110 and the other terminal connected to the second signal terminals 120–129. The control terminals of the second electronic switches 160–169 are connected to the first enable pin 130 to control the conduction between the first and the second signal terminals 101–110 and 120–129. By switching between the first electronic switches 150–159 and the second electronic switches 160–169, the first and the second signals 101–110 and 120–129 can select use of the terminators 131–140. When the first electronic switches 150–159 are conducted, the second electronic switches 160–169 are open. Therefore, the first signal terminals 101–110 have the terminators 131–140.

When the second electronic switches 160–169 are conducted, the first electronic switches 101–110 are open, and the second signal terminals 120–129 can output to external directly. It is appreciated that people of ordinary skill in the art may understand that effects with other states are obtained when the first and second electronic switches 150–159 and 160–169 are both conducted or opened.

The above synthesizer 100 may further comprise a first source pin 170. Each of the terminators 131–140 has a first terminal 171–180 and a second terminal 181–190, respectively. The first terminals 171–180 are connected to the first source pin 170, and the second terminals 181–190 are connected to the first electronic switches 150–159. A second source pin 172 may also be included in the above synthesizer 100. The first source pin 170 and second source pin 172 are located in symmetric positions of a package for the synthesizer 100. The first source pin 170 is coupled to the second source pin 172. The first and the second source pins 170 and 172 may be located at the uppermost and lowermost symmetric positions of the same side of the package. The first and second source pins 170 and 172 of the synthesizer 100 are connected with the source pins of other synthesizers in series. The first enable pin 130 and the second enable pin 174 are located at symmetric positions of the package of the synthesizer 100. The first enable pin 130 is coupled to the second enable pin 174. The arrangement of these pins is advantageous in that they reduce the leading space while connecting the synthesizer 100 with others on a motherboard. The first and second electronic switches 150–159 and 160–169 are made of transmission gates.

Figure 2:
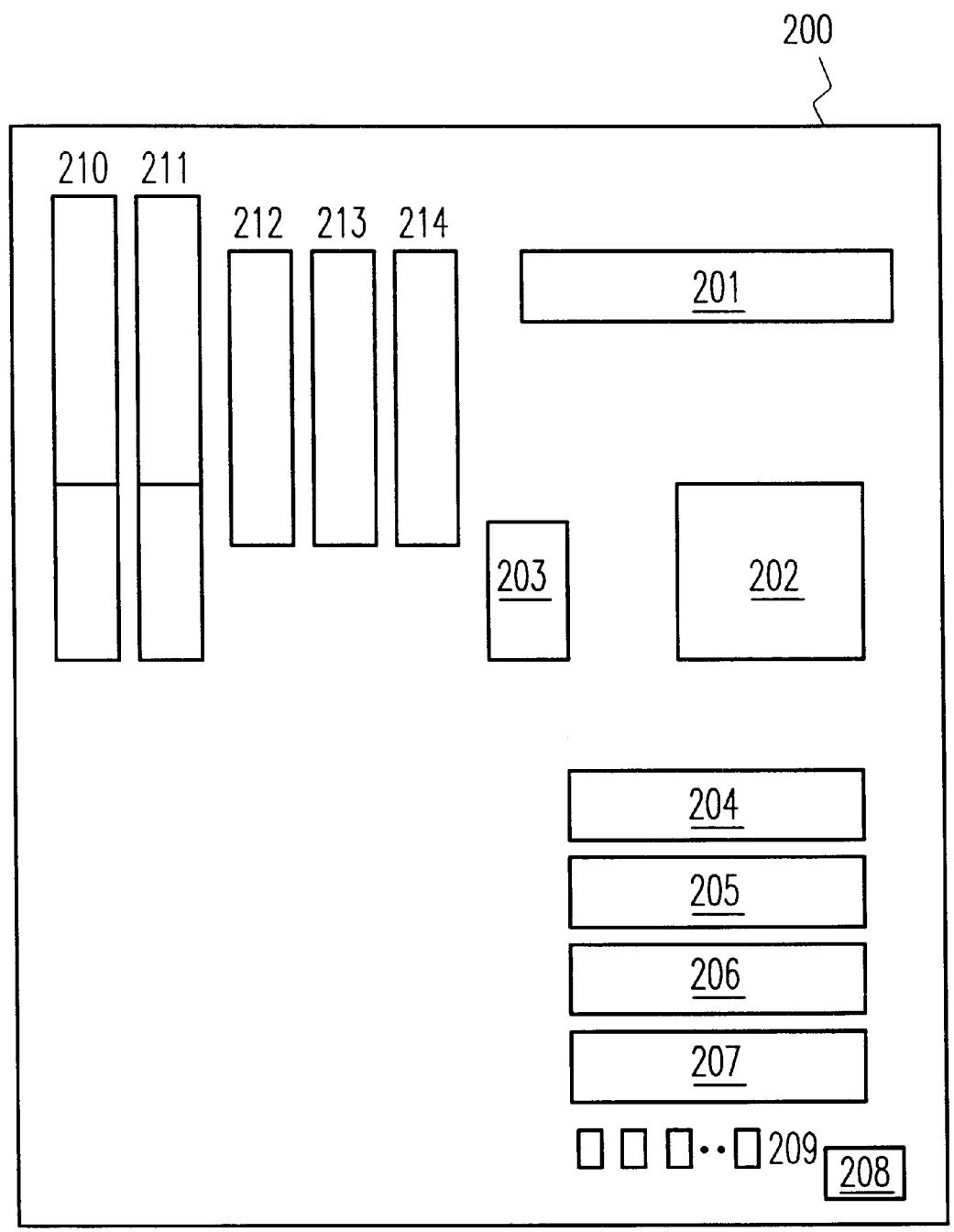
FIG. 2 shows the layout of components of a computer motherboard that supports DDR DRAM.

FIG. 2 shows the layout of components of a computer motherboard that supports DDR DRAM. The computer motherboard 200 that supports DDR DRAM memory module comprises a CPU slot 201, a control chip set 202, a differential clock generator 203, memory module slots 204–207, voltage modulator 208, terminators 209, PCI slots 212–214 and ISA slots 210–211. The CPU slot 201 is used for insertion of a CPU. The control chip set 202 is the control chip set that supports DDR DRAM memory module. The differential clock generator 203 generates a differential clock signal required by the DDR DRAM. The memory module slots 204–207 are used for installation of DDR DRAN memory modules. The voltage modulator 208 provides a terminal voltage required by a data bus connected to the DDR DRAM memory module. The terminators 209 are used to absorb the electric wave transmitted by the data bus connected to the DDR DRAM memory module. The PCI slots 212–214 are for installation of PCI interface cards and the ISA slots 210–211 are used to install ISA interface cards.

Referring to FIG. 2, the terminators 209 and the voltage modulator 208 are installed on the printed circuit board of the motherboard 200. The conventional motherboard 200 can only support a DDR DRAM memory module and cannot support the SDRAM. The cost of DDR DRAM memory module is much higher than that of SDRAM. Therefore, the DDR DRAM memory modules are suitable for use in a high-level computer system such as net server.

Figure 3:
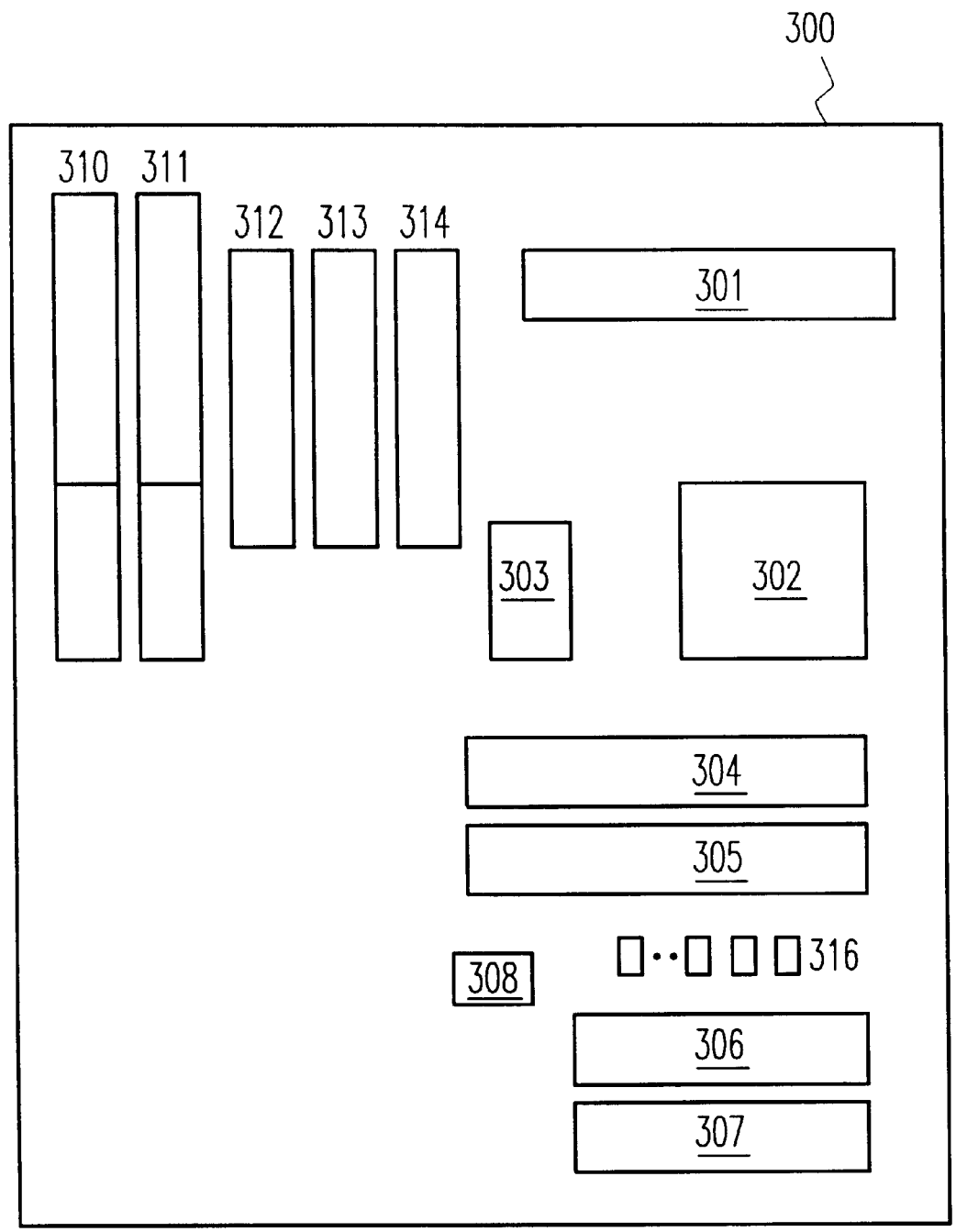
FIG. 3 shows the layout of components of a computer motherboard that supports SDRAM/DDR DRAM.

FIG. 3 shows the layout of components of a motherboard that supports SDRAM/DDR DRAM. The motherboard 300 comprises a CPU slot 301, a control chip set 302, a clock generator 303, first memory module slots 304–305, second memory module slots 306–307, PCI slots 312–314, ISA slots 310–311 and a synthesizer 316. The functions of the CPU slot 301, the voltage modulator 308 and the ISA slots 310–311 are the same as the similar components illustrated in FIG. 2. The first memory module slots 304–305 are for embedding first memory modules. Terminators are required when operating the first memory modules terminator. The second memory modules 306–307 are used to install second memory modules. In this embodiment, the first memory modules include double data rate dynamic random access memories and the second memory modules include synchronous dynamic random access memories.

The synthesizer 316 can have the same structure as shown in FIG. 1. The synthesizer 316 is coupled to the first and the second memory module slots 304–305 and 306–307. When the first memory modules are inserted in the first memory module slots 304 and 305, the synthesizer 316 provides an equivalent terminator. Meanwhile, the first memory module slots 304–305 do not conduct with the second memory module slots 306–307. When the second memory modules are inserted in the second memory module slots 306–307, the synthesizer 316 does not provide the equivalent terminator, and the first and second memory module slots 304–305 and 306–307 conduct with each other. The control chip set 302 is coupled to the first memory module slots 304–305 and the synthesizer 316. When the first memory modules are inserted in the first memory module slots 304–305, the control chip set 302 operates at a double data rate operation mode. When the second memory modules are inserted in the second memory module slots 306–307, the control chip set 302 operates with a normal operation data rate.

Further referring to FIG. 3, since the first memory module slots 304–305 in the motherboard 300 are double data rate memory modules operated under a double data rate mode, a more stable transmission environment is required due to the faster rate. Therefore, the first memory module slots 304–306 are closer to the control chip to provide a more stable transmission environment.

According to the invention, a synthesizer able to control the conduction of terminators is provided. The synthesizer can be applied to a motherboard, so that the motherboard can use the standard synchronous dynamic random access memory and the standard double data rate dynamic random access memory with great flexibility. The manufacturer can thus save the cost for fabricating various modules. Consumers also benefit from the added convenience.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An apparatus that supports memory modules with terminators and memory modules without terminators, comprising:
    a first memory module slot, to connect a first memory module, said first memory module slot requiring a terminator for operation;
    a second memory module slot, to connect a second memory module;
    a synthesizer, connected to said first and second memory module slots, wherein when said first memory module is inserted into said first memory module slot, said synthesizer provides an equivalent terminator, and when said second memory module slot is inserted into said second memory module slot, said synthesizer providing no equivalent terminator; and
    a control chip set, coupled to said first memory module slot and said synthesizer, wherein when said first memory module is inserted into said first memory module slot, said control chip set operates at a first memory module operation mode.

2. The apparatus of claim 1, wherein said first memory module includes a double data rate dynamic random access memory, and said second memory module includes a synchronous dynamic random access memory.

3. The apparatus to claim 2, further comprising:
    a clock generator, coupled to said first and said second memory module slots, wherein when said first memory module is inserted into said first memory module slot, said clock generator generates a differential clock signal, and when said second memory module is inserted into said second memory module slot, said clock generator generates a normal clock signal.

4. The apparatus of claim 1, wherein said synthesizer comprises:
    a first signal terminal, for external connection;
    a second signal terminal, for external connection;
    an enable pin;
    a terminator;
    a first electronic switch, with one terminal coupled to said first signal terminal, another terminal coupled to said terminator, and a control terminal coupled to said enable pin to control conduction between said terminator and said first signal terminal; and
    a second electronic switch, with one terminal coupled to said first signal terminal, another terminal coupled to said second signal terminal, and a control terminal coupled to said enable pin to control conduction between said first signal terminal and said second signal terminal.

5. The apparatus of claim 4, wherein said synthesizer further comprises a first source pin connected to a first terminal of said terminator, while a second terminal of said terminator is connected to said first electronic switch.

6. The apparatus of claim 5, wherein said synthesizer further comprises a second source pin, wherein said first and second source pins are located in symmetric positions of a package of said synthesizer, and said first source pin is coupled to said second source pin.

7. The apparatus of claim 6, wherein said first and second source pins are located at an uppermost and a lowermost positions at one side of said package of said synthesizer.

8. The apparatus of claim 7, wherein said source pins of said synthesizer are coupled to source pins of other synthesizers.

9. The apparatus of claim 4, wherein first and second electronic switches are made of transmission gates.

10. The apparatus of claim 4, wherein said control chip set is coupled to said first memory module slot and said first signal terminal of said synthesizer, and wherein when said first memory module is inserted into said first memory module slot, said first electronic switch conducts and said second electronic switch is open, and when said second memory module is inserted into said second memory module slot, said second electronic switch conducts and said first electronic switch is open.

11. An apparatus, comprising:
    a match apparatus, allowing an user to install an apparatus that requires a terminator and an apparatus that does not require a terminator; and
    a synthesizer, coupled to said match apparatus, wherein when said match apparatus uses said apparatus that requires said terminator said synthesizer provides an equivalent resistor, and when said match apparatus uses said apparatus that does not require said terminator said synthesizer does not provide said equivalent resistor.

12. The apparatus of claim 11, wherein said synthesizer further comprises:
    a first signal terminal, for external connection;
    a second signal terminal, for external connection;
    an enable pin;
    a terminator;

a first electronic switch, with one terminal coupled to said first signal terminal, another terminal coupled to said terminator, and a control terminal coupled to said enable pin to control conduction between said terminator and said first signal terminal; and a second electronic switch, with one terminal coupled to said first signal terminal, another terminal coupled to said second signal terminal, and a control terminal coupled to said enable pin to control conduction between said first signal terminal and said second signal terminal.

13. The apparatus of claim 11, wherein said synthesizer further comprises a first source pin and a second source pin, said terminator comprises a first terminal and a second terminal, said first terminal is coupled to said first source pin, said second terminal is coupled to said first electronic switch, said first source pin and said second source pin are located in symmetric positions of a package of said synthesizer, and said first source pin is coupled to said second source pin.

* * * * *